(12) United States Patent
Stachler

(10) Patent No.: US 8,483,850 B2
(45) Date of Patent: Jul. 9, 2013

(54) HVAC SYSTEM, A METHOD FOR DETERMINING A LOCATION OF AN HVAC UNIT WITH RESPECT TO A SITE AND AN HVAC CONTROLLER

(75) Inventor: John P. Stachler, Plano, TX (US)

(73) Assignee: Lennox Industries Inc., Richardson, TX (US)

( * ) Notice: Subject to any disclaimer, the term of this patent is extended or adjusted under 35 U.S.C. 154(b) by 248 days.

(21) Appl. No.: 12/694,458

(22) Filed: Jan. 27, 2010

(65) Prior Publication Data

US 2010/0298986 A1 Nov. 25, 2010

Related U.S. Application Data

(60) Provisional application No. 61/180,405, filed on May 21, 2009.

(51) Int. Cl.
*G05B 11/01* (2006.01)
*G05B 15/00* (2006.01)
*G05D 23/00* (2006.01)

(52) U.S. Cl.
USPC .............................. 700/83; 700/17; 236/51

(58) Field of Classification Search
USPC ..................................... 700/17, 83; 236/51
See application file for complete search history.

(56) References Cited

U.S. PATENT DOCUMENTS

| | | | | |
|---|---|---|---|---|
| 5,553,661 | A | * | 9/1996 | Beyerlein et al. ............. 165/203 |
| 5,754,767 | A | * | 5/1998 | Ruiz ............................. 709/220 |
| 5,825,096 | A | * | 10/1998 | Morimoto et al. ............. 307/9.1 |
| 6,667,690 | B2 | * | 12/2003 | Durej et al. ................. 340/572.1 |
| 6,738,014 | B2 | * | 5/2004 | Ueda et al. ............... 342/357.46 |
| 6,874,692 | B2 | * | 4/2005 | Ueda et al. ...................... 236/51 |
| 7,089,089 | B2 | * | 8/2006 | Cumming et al. ............ 700/295 |
| 7,383,158 | B2 | * | 6/2008 | Krocker et al. ............... 702/186 |
| 7,424,345 | B2 | * | 9/2008 | Norbeck ....................... 700/276 |
| 7,775,453 | B2 | * | 8/2010 | Hara ............................. 236/51 |
| 7,979,163 | B2 | * | 7/2011 | Terlson et al. ................ 700/276 |
| 8,042,352 | B2 | * | 10/2011 | Deangelis ....................... 62/260 |
| 8,219,249 | B2 | * | 7/2012 | Harrod et al. ................. 700/276 |
| 2007/0162615 | A1 | * | 7/2007 | Rusu ............................. 709/245 |
| 2007/0225868 | A1 | * | 9/2007 | Terlson et al. ................ 700/276 |
| 2010/0070089 | A1 | * | 3/2010 | Harrod et al. ................. 700/277 |

FOREIGN PATENT DOCUMENTS

WO WO03000513 * 3/2003

* cited by examiner

*Primary Examiner* — Ronald Hartman, Jr.

(57) ABSTRACT

An HVAC controller, a method determining a location of a HVAC unit with respect to a site where the HVAC unit is installed and a HVAC system are disclosed herein. In one embodiment, the HVAC controller includes: (1) an interface configured to receive location data indicating a position of said HVAC unit with respect to the earth, (2) a memory coupled to said interface and configured to store said location data and a processor configured to retrieve said location data from said memory, wherein said retrieved location data is employed to determine a location of said HVAC unit with respect to a site where said HVAC unit is installed.

20 Claims, 2 Drawing Sheets

HVAC SYSTEM, A METHOD FOR DETERMINING A LOCATION OF AN HVAC UNIT WITH RESPECT TO A SITE AND AN HVAC CONTROLLER

CROSS-REFERENCE TO RELATED APPLICATION

This application claims the benefit of U.S. Provisional Application Ser. No. 61/180,405, filed by Mark Beste, et al., on May 21, 2009, entitled "Comprehensive HVAC Control System," and incorporated herein by reference in its entirety.

TECHNICAL FIELD

This application is directed, in general, to heating, ventilating and air conditioning (HVAC) systems and, more specifically, to determining the location of HVAC units with respect to a particular installation.

BACKGROUND

HVAC systems can be used to regulate the environment within an enclosed space. Typically, an air blower is used to pull air from the enclosed space into the HVAC system through ducts and push the air back into the enclosed space through additional ducts after conditioning the air (e.g., heating, cooling or dehumidifying the air). Various types of HVAC systems, such as rooftop units, may be used to provide conditioned air for enclosed spaces.

At a particular site, multiple HVAC units may be used to provide conditioned air for an enclosed space. For example, one building may employ multiple rooftop units to provide conditioned air. It may often prove beneficial to know the location of each HVAC unit with respect to the building. By knowing the location, a repairman can more easily determine the best route to a particular unit, which unit needs service, etc. Knowing the location of the HVAC units with respect to the building, however, may require a customer or contractor to manually denote the location and names of each particular unit.

SUMMARY

In one aspect, a HVAC controller is disclosed that includes: (1) an interface configured to receive location data indicating a position of the HVAC unit with respect to the earth, (2) a memory coupled to the interface and configured to store the location data and (3) a processor configured to retrieve the location data from the memory, wherein the retrieved location data is employed to determine a location of the HVAC unit with respect to a site where the HVAC unit is installed.

In another aspect, a method for determining a location of a HVAC unit with respect to a site where the HVAC unit is installed is disclosed. The method of this particular embodiment includes: (1) receiving location data at a HVAC controller of the HVAC unit, the location data indicating a position of the HVAC unit with respect to the earth, (2) storing location data in a memory of the HVAC controller and (3) determining a location of the HVAC unit with respect to a site where the HVAC unit is installed, wherein the determining is based on the location data.

In yet another aspect, a HVAC system is provided that includes at least one HVAC unit having a HVAC controller configured to direct operation of the HVAC unit and including: (1) an interface configured to receive location data indicating a position of the HVAC unit with respect to the earth, (2) a memory coupled to the interface and configured to store the location data and (3) a processor configured to retrieve the location data from the memory, wherein the retrieved location data is employed to determine a location of the HVAC unit with respect to a site where the HVAC unit is installed.

BRIEF DESCRIPTION

Reference is now made to the following descriptions taken in conjunction with the accompanying drawings, in which.

DETAILED DESCRIPTION

This disclosure provides embodiments for determining the location of a HVAC unit employing a location system and location data received from the location system. As such, one does not have to physically determine the location or manually denote the names of HVAC units at a particular location. Instead, this information may be automatically provided. By knowing the location of HVAC equipment, a repairman may more easily determine the best route to a particular unit, which unit needs service, etc.

The location system may be, for example, a Global Positioning System (GPS). Accordingly, a GPS transceiver may be used to provide the location data. The unique GPS coordinates of a GPS transceiver associated with a HVAC unit can be stored in the HVAC controller of the HVAC unit for later retrieval. The stored GPS coordinates may even be retrieved if the GPS transceiver is removed or is inoperable. A communications network may be used to retrieve the GPS coordinates from a remote location. Additionally, the GPS coordinates may be downloaded from the HVAC controller via an interface thereof. For example, a universal serial bus (USB) port may be used to download the location data to a portable memory such as a memory stick.

The GPS coordinates may be transmitted over the communications network and employed in various computer programs designed for managing and operating HVAC systems. In certain embodiments the GPS coordinates may be used by a mapping program that automatically creates a map of the HVAC unit with respect to a particular installation. Additionally, a tracking program may employ the GPS coordinates to verify service and/or commissioning of the HVAC unit. Additional data may also be transmitted over the communications network, such as serial numbers and model numbers. Thus, instead of simply reporting a serial number or a model number of a HVAC unit, the disclosed embodiments provide that the HVAC controller may verify the actual location of the HVAC on the earth's surface at the time of the report, or at least when the last GPS communication occurred. This also may be included in the data that may be transmitted.

A controller for a HVAC unit is configured to direct the operation of a HVAC unit. Typically, each HVAC unit will include a designated controller. A HVAC controller may be one or more electric circuit boards including at least one micro-processor or micro-controller integrated circuit. The HVAC controller also includes the support circuitry for power, signal conditioning, and associated peripheral devices. In addition to a processor, the HVAC controller may include a memory having a program or series of operating instruction (i.e., firmware or software) that executes in such a way as to implement at least some of the features described herein when initiated by the processor. Additionally, the processor is configured to provide control functionality beyond the scope of the present disclosure.

Figure 1:
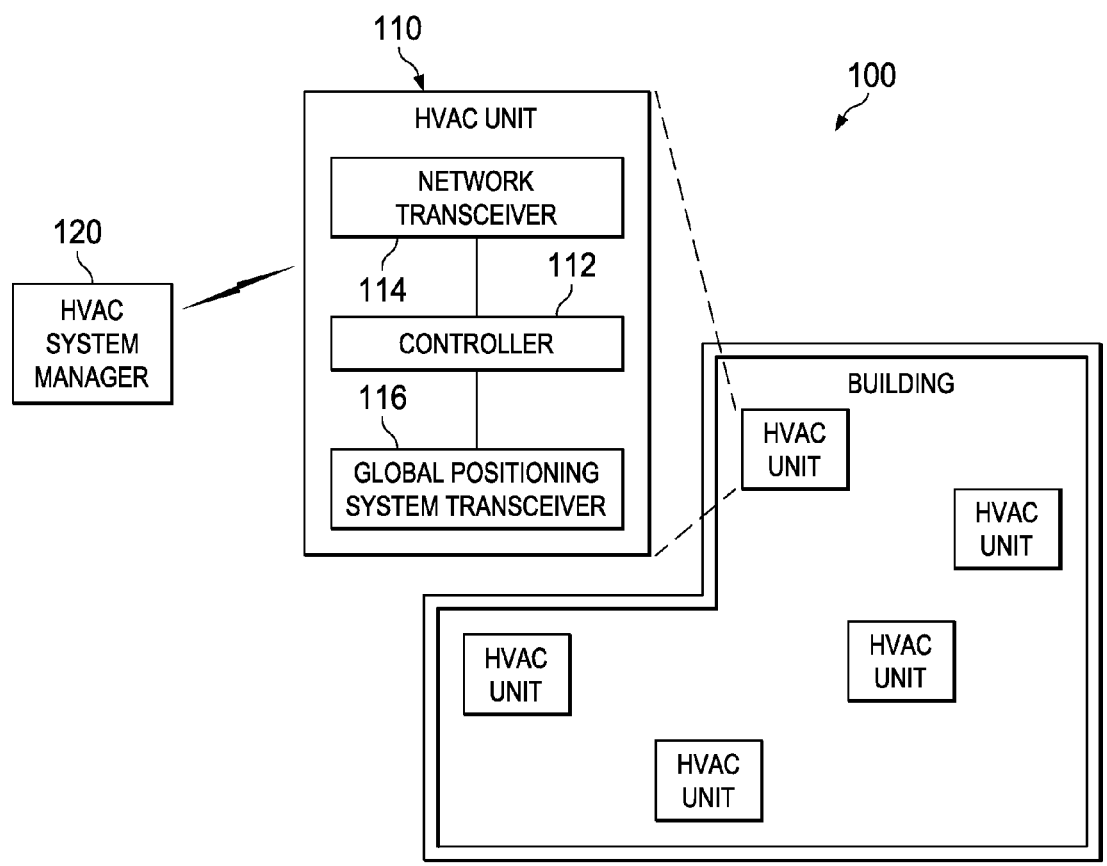
FIG. 1 is a block diagram of an embodiment of a HVAC system constructed according to the principles of the disclosure.

FIG. 1 is a block diagram of an embodiment of a HVAC system 100 constructed according to the principles of the disclosure. The HVAC system 100 may include multiple HVAC units at a single site, as shown. In FIG. 1, the site is a building and the HVAC units are rooftop units. One skilled in the art will understand that the type of HVAC units in the HVAC system 100 may vary. Additionally, each of the HVAC units may be the same type (i.e., model) of HVAC unit or there may be different types of HVAC units within the HVAC system 100. The multiple HVAC units of the HVAC system 100 are represented by HVAC unit 110. As such, the following discussion regarding the HVAC unit 110 may also apply to each of the other multiple HVAC units. The HVAC system 100 also includes a HVAC system manager 120.

The HVAC unit 110 includes a HVAC controller 112, a network transceiver 114 and a location system transceiver 116. The network transceiver 114 and the location system transceiver 116 are coupled to the HVAC controller 112. The network transceiver 114 and the location system transceiver 116 may be conventional devices well known in the art. For example, the location system transceiver 116 may be a GPS transceiver and will be referenced as such herein.

Figure 2:
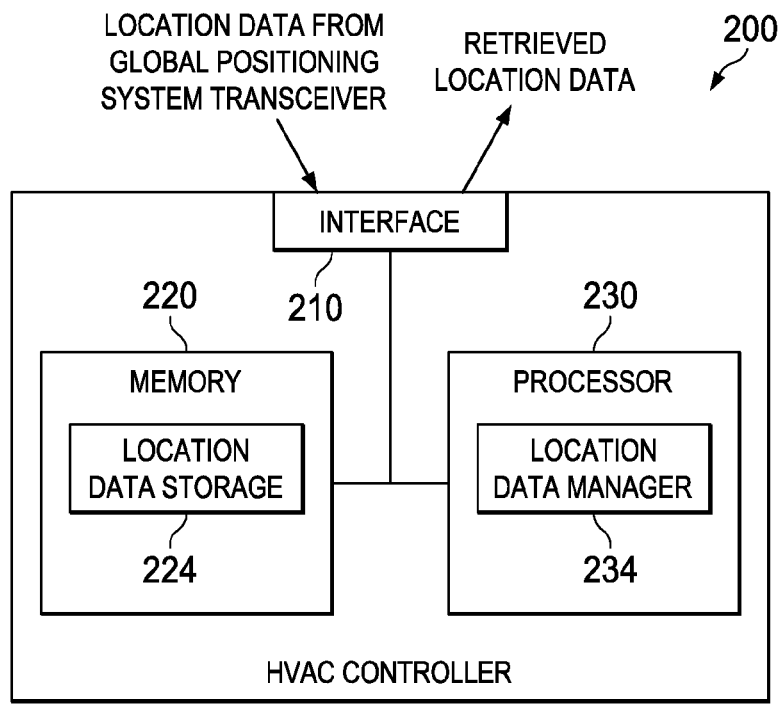
FIG. 2 is a diagram of an embodiment of a HVAC controller constructed according to the principles of the disclosure.

One skilled in the art will also understand that the HVAC unit 110 includes heating, cooling and blower (HCB) components that are typically included in a HVAC unit. The HCB components are not presently illustrated or discussed but are typically included in a HVAC unit, such as, a compressor, an indoor air blower, an outdoor fan and an electrical heating element. Typical components may also include a power supply, an expansion valve, a temperature sensor, etc. The various components of the HVAC unit 110 may be contained within a single enclosure (e.g., a cabinet). The HVAC controller 112 is configured to direct the operation of the various HCB components. FIG. 2 provides more detail of a HVAC controller constructed according to the disclosure.

The HVAC controller 112 is configured to receive location data indicating a position of the HVAC unit 110 with respect to the earth. The location data may be received from the GPS transceiver 116 and include unique GPS coordinates for the HVAC unit 110. A memory of the HVAC controller 112 may be used to store the received location data. The HVAC controller 112 may also include a processor that is configured to retrieve the location data from the memory. The retrieved location data can then be employed to determine a location of the HVAC unit 110 with respect to the building where the HVAC unit 110 is installed. The retrieved location data can also be used to determine the location of the HVAC unit 110 with respect to the other multiple HVAC units at the building. The respective location of the HVAC unit may be provided via a map that is generated based on the location data and building information. In one embodiment, the HVAC controller 112 may be configured to determine the location of the HVAC unit 110 with respect to the building and the other HVAC units. In other embodiments, the HVAC system manager 120 may be employed to determine the location.

The HVAC system manager 120 is configured to determine the location of the HVAC unit 110 with respect to the building. In one embodiment, the HVAC system manager 120 is configured to create the map of the building employing the location data and with the location of the HVAC unit 110 denoted. In one embodiment, the HVAC system manager 120 may automatically create the map upon receipt of the location data. Accordingly, the HVAC system manager 120 may employ the location data from each of the multiple HVAC units to create a map of the multiple HVAC units with respect to the building.

The HVAC system manager 120 may also verify servicing and or commissioning of the HVAC unit 110 employing the location data. The HVAC system manager 120 may also be configured to receive identification information from the HVAC controller 112 for the HVAC unit 110 and employ the identification information when verifying. The identification information may include serial number or model number information of the HVAC unit 110 itself or individual components of the HVAC unit 110. In some embodiments, the HVAC controller 112 may be used to verify servicing and commissioning.

The HVAC system manager 120 may be located remotely from the site or from the HVAC unit 110. For example, the HVAC system manager 120 may be located at a HVAC contractor's office or even within the building at a maintenance supervisor's office. Accordingly, the location data and identification information may be transmitted to the HVAC system manager 120 over a communications network. The communications network may be a conventional network that is employed for communicating data. The network transceiver 114 may be used to send the location data and identification information to the HVAC system manager 120. The HVAC system manager 120 may also include or be coupled to another network transceiver to receive the location data and identification information. As illustrated, a wireless connection may be used to couple the HVAC system manager 120 to the HVAC unit 110.

The HVAC system manager 120 may be a general computing device having a memory and a processor wherein the memory includes a series of operating instructions that are used to direct the processor when initiated thereby. In one embodiment, the HVAC system manager 120 is a dedicated computing device having the necessary hardware, firmware, software or a combination thereof to perform the designated operations disclosed herein. The HVAC system manager 120 may also be configured to generate the map for printing or downloading to a portable memory or computing device.

FIG. 2 is a diagram of an embodiment of a HVAC controller 200 constructed according to the principles of the disclosure. In the illustrated embodiment, the HVAC controller 200 includes an interface 210, a memory 220 and a processor 230. The HVAC controller 200 can be configured to direct the operation of a HVAC unit, such as a rooftop HVAC unit. The HVAC controller 200 may also include additional components typically included within a controller for a HVAC unit, such as a power supply or power port.

The interface 210 may be a conventional interface that is used to receive and transmit data for a controller, such as a microcontroller. The interface 210 is configured to receive location data indicating a position of the HVAC unit with respect to the earth. The location data may be received from a GPS transceiver associated with the HVAC unit. The location data may be unique GPS coordinates from the GPS transceiver. In some embodiments, the location data may be from a receiver of another type of location system.

The interface 210 may be a conventional device for transmitting and receiving data and may include multiple ports for transmitting and receiving data. The ports may also be conventional receptacles for communicating data via various means such as, a portable memory device, a PC or portable computer or a communications network. The interface 210 may be coupled to a network transceiver or a GPS transceiver to provide communication between the transceivers and the HVAC controller 200. The interface 210 is also coupled to the memory 220.

The memory 220 is coupled to the interface 210 and is configured to store the location data. The memory may be a conventional memory typically located within a microcontroller that is constructed to store data and computer programs. The memory 220 may store operating instructions to direct the operation of the processor 230 when initiated thereby. The location data may be stored in a dedicated location of the memory such as location data storage 224.

The processor 230 may be a conventional processor such as a microprocessor. The processor 230 can be configured to retrieve location data from the memory 220. The retrieved location data may then be employed to determine a location of the HVAC unit with respect to a site where the HVAC unit is installed. In one embodiment, the processor is further configured to send the retrieved location data to a HVAC system manager that is configured to determine the location of the HVAC unit with respect to the site. Additionally, the processor 230 is further configured to send identification information for the HVAC unit to the HVAC system manager. The processor 230 may send the retrieved location data to the HVAC system manager over a communications network via the interface 210. A location data manager 234 may be a dedicated section of the processor 230 that is configured to direct the receiving, storing, retrieving and sending of the location data. In some embodiments, the location data manager 234 may also be configured to determine the respective location of the HVAC unit regarding the installation site. This respective location information can then be downloaded to a portable memory or a portable computing device via the interface 210.

Figure 3:
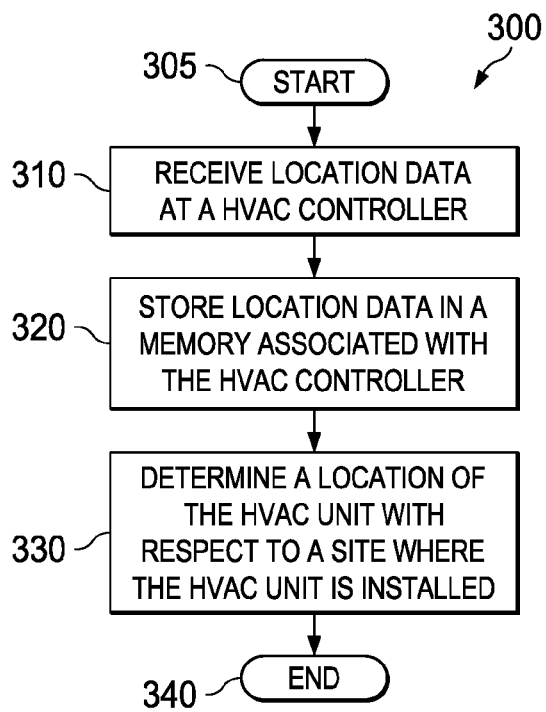
FIG. 3 is a flow diagram of an embodiment of a method for determining the location of a HVAC unit with respect to a site where the HVAC unit is installed carried out according to the principles of the disclosure.

FIG. 3 is a flow diagram of an embodiment of a method 300 for determining the location of a HVAC unit with respect to a site where the HVAC unit is installed carried out according to the principles of the disclosure. As mentioned above, the HVAC unit may be a rooftop unit that includes a refrigeration circuit, an indoor air blower system an outdoor fan system and a heating element. An HVAC controller such as described with respect to FIG. 1 or FIG. 2 may be used to perform the method 300. A portion of the method 300 may represent an algorithm that is stored on a computer readable medium, such as a memory of an HVAC controller (e.g., the memory 220 of FIG. 2) as a series of operating instructions that can direct the operation of a processor (e.g., the processor 230 of FIG. 2). The method 300 begins in a step 305.

In a step 310, location data is received at a controller for the HVAC unit. The location data indicates a position of the HVAC unit with respect to the earth. In one embodiment, the location data is unique GPS coordinates that are receive from a GPS transceiver coupled to the HVAC unit.

The location data is stored in a memory associated with the HVAC controller in a step 320. The location data may be stored in a memory of the HVAC controller. In one embodiment, the location data may be stored in a designated section of the HVAC controller memory.

In a step 330, a location of the HVAC unit is determined with respect to a site where the HVAC unit is installed. The location of the HVAC unit is determined based on the location data. The HVAC controller may determine the location. Alternatively, the HVAC controller may retrieve the location data from the memory and direct the retrieved location data to a HVAC system manager to determine the location. In some embodiments, the HVAC system manager can be configured to present the location via a map of the site. A site map indicating the location of the HVAC unit may also be downloaded from the HVAC controller or the HVAC system manager via a portable memory or portable computing device.

In addition to the location data, the HVAC controller may also send identification information to the HVAC system manager. The HVAC system manager can then employ the location data and the identification to verify servicing or commissioning of the HVAC unit. The method 300 then ends in a step 340.

The above-described methods or at least portions thereof may be embodied in or performed by various conventional digital data processors, microprocessors or computing devices, wherein these devices are programmed or store executable programs of sequences of software instructions to perform one or more of the steps of the methods, e.g., steps of the method of FIG. 3. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computing devices to perform one, multiple or all of the steps of one or more of the above-described methods, e.g., one or more of the steps of the method of FIG. 3. Additionally, an apparatus, such as dedicated HVAC controller, may be designed to include the necessary circuitry to perform or direct the performance of steps of the methods of FIG. 3.

Those skilled in the art to which this application relates will appreciate that other and further additions, deletions, substitutions and modifications may be made to the described embodiments.

What is claimed is:

1. A controller for a heating, ventilating and air conditioning (HVAC) unit, comprising:
   an interface configured to receive location data indicating a position of said HVAC unit with respect to the Earth;
   a memory coupled to said interface and configured to store said location data; and
   a processor configured to retrieve said location data from said memory, determine, employing said retrieved location data, a location of said HVAC unit with respect to a building where said HVAC unit is operatively installed, and generate a map of said building based on said location data with said location of said HVAC unit denoted thereon.

2. The HVAC controller as recited in claim 1 wherein said location data is received from a GPS transceiver coupled to said HVAC unit and is unique GPS coordinates for said HVAC unit.

3. The HVAC controller as recited in claim 1 wherein said map of said building is generated based also on a building information of said building location.

4. The HVAC controller as recited in claim 1 wherein said processor is further configured to send said retrieved location data to a HVAC system manager that is configured to determine said location of said HVAC unit with respect to said site.

5. The HVAC controller as recited in claim 4 wherein said processor is further configured to send identification information for said HVAC unit to said HVAC system manager.

6. The HVAC controller as recited in claim 1 wherein said HVAC unit is a rooftop unit.

7. The HVAC controller as recited in claim 4 wherein said processor is configured to send said retrieved location data to said HVAC system manager over a communications network via said interface.

8. A method for determining a location of a HVAC unit with respect to a building site where the HVAC unit is installed, comprising:
receiving location data at a HVAC controller of said HVAC unit, said location data indicating a position of said HVAC unit with respect to the Earth;
storing location data in a memory associated with said HVAC controller; and
determining a location of said HVAC unit, with respect to a building site where said HVAC unit is operatively installed, based on said location data; and
generating a map of said building site based on said location data with said location of said unit denoted thereon.

9. The method as recited in claim 8 wherein said location data is received from a GPS transceiver coupled to said HVAC unit.

10. The method as recited in claim 8 wherein said location data is unique GPS coordinates for said HVAC unit.

11. The method as recited in claim 8 further comprising retrieving said location data from said memory employing a processor of said HVAC controller.

12. The method as recited in claim 11 further comprising sending, via said interface, said retrieved location data to a HVAC system manager employing said processor and employing said HVAC system manager to determine said location of said HVAC unit with respect to said site based on said retrieved location data.

13. The method as recited in claim 12 further comprising sending identification information for said HVAC unit to said HVAC system manager, wherein said processor directs said sending of said identification information and said location data over a communications network via said interface.

14. The method as recited in claim 8 wherein said generating said map of said building site is based also on a building information of said building site.

15. A heating, ventilating and air conditioning (HVAC) system, comprising:
at least one HVAC unit, including:
a HVAC controller configured to direct operation of said HVAC unit, said controller having:
an interface configured to receive location data indicating a position of said HVAC unit with respect to the Earth;
a memory coupled to said interface and configured to store said location data; and
a processor configured to retrieve said location data from said memory and determine, employing said retrieved location data, a location of said HVAC unit with respect to a site where said HVAC unit is operatively installed, and generate a map of said site with said location of said HVAC unit denoted thereon based on said location data.

16. The HVAC system as recited in claim 15 further comprising a GPS transceiver coupled to said HVAC unit, wherein said location data is received from said GPS transceiver and is unique GPS coordinates for said HVAC unit.

17. The HVAC system as recited in claim 15 further comprising a HVAC system manager configured to determine said location of said HVAC unit with respect to said site.

18. The HVAC system as recited in claim 17 wherein said HVAC unit further includes a network transceiver, said processor further configured to send said retrieved location data to said HVAC system manager via said network transceiver.

19. The HVAC system as recited in claim 18 wherein said processor is further configured to send identification information for said HVAC unit to said HVAC system manager via said network transceiver.

20. The HVAC system as recited in claim 15 wherein said site is a building and said HVAC system includes multiple HVAC units, wherein each of said multiple HVAC units is a rooftop unit with each said rooftop unit having a unique HVAC controller.

* * * * *

UNITED STATES PATENT AND TRADEMARK OFFICE
CERTIFICATE OF CORRECTION

PATENT NO. : 8,483,850 B2
APPLICATION NO. : 12/694458
DATED : July 9, 2013
INVENTOR(S) : John P. Stachler Page 1 of 1

It is certified that error appears in the above-identified patent and that said Letters Patent is hereby corrected as shown below:

In the Claims:

In Column 6, Claim 3, Line 54 after the word building, delete the word "location"

Signed and Sealed this
Seventeenth Day of September, 2013

Teresa Stanek Rea
*Deputy Director of the United States Patent and Trademark Office*